United States Patent
Bayley

(10) Patent No.: US 6,909,471 B2
(45) Date of Patent: Jun. 21, 2005

(54) AUDIO VOLUME CONTROL

(75) Inventor: Michael W. Bayley, San Jose, CA (US)

(73) Assignee: Scientific-Atlanta, Inc., Lawrenceville, GA (US)

( * ) Notice: Subject to any disclaimer, the term of this patent is extended or adjusted under 35 U.S.C. 154(b) by 73 days.

(21) Appl. No.: 10/308,577

(22) Filed: Dec. 3, 2002

(65) Prior Publication Data

US 2004/0107442 A1 Jun. 3, 2004

(51) Int. Cl.[7] .............................................. H04N 5/60
(52) U.S. Cl. ...................... 348/738; 381/104; 725/151
(58) Field of Search ............................. 348/738, 726, 348/737, 632; 381/1, 104, 109, 107; 725/151; H04N 5/60

(56) References Cited

U.S. PATENT DOCUMENTS

| 4,536,798 A | * | 8/1985 | Reid et al. ................... 348/737 |
| 5,027,687 A | * | 7/1991 | Iwamatsu ..................... 84/600 |
| 5,428,404 A | * | 6/1995 | Ingram et al. ............... 348/726 |

* cited by examiner

*Primary Examiner*—Michael H. Lee

(57) ABSTRACT

Systems and method for controlling audio volume are provided. One method for controlling audio volume includes receiving a user input requesting a first volume-type that is associated with a first audible volume level, and responsive to receiving the user input, modifying an audio signal to achieve the first audible volume level.

21 Claims, 11 Drawing Sheets

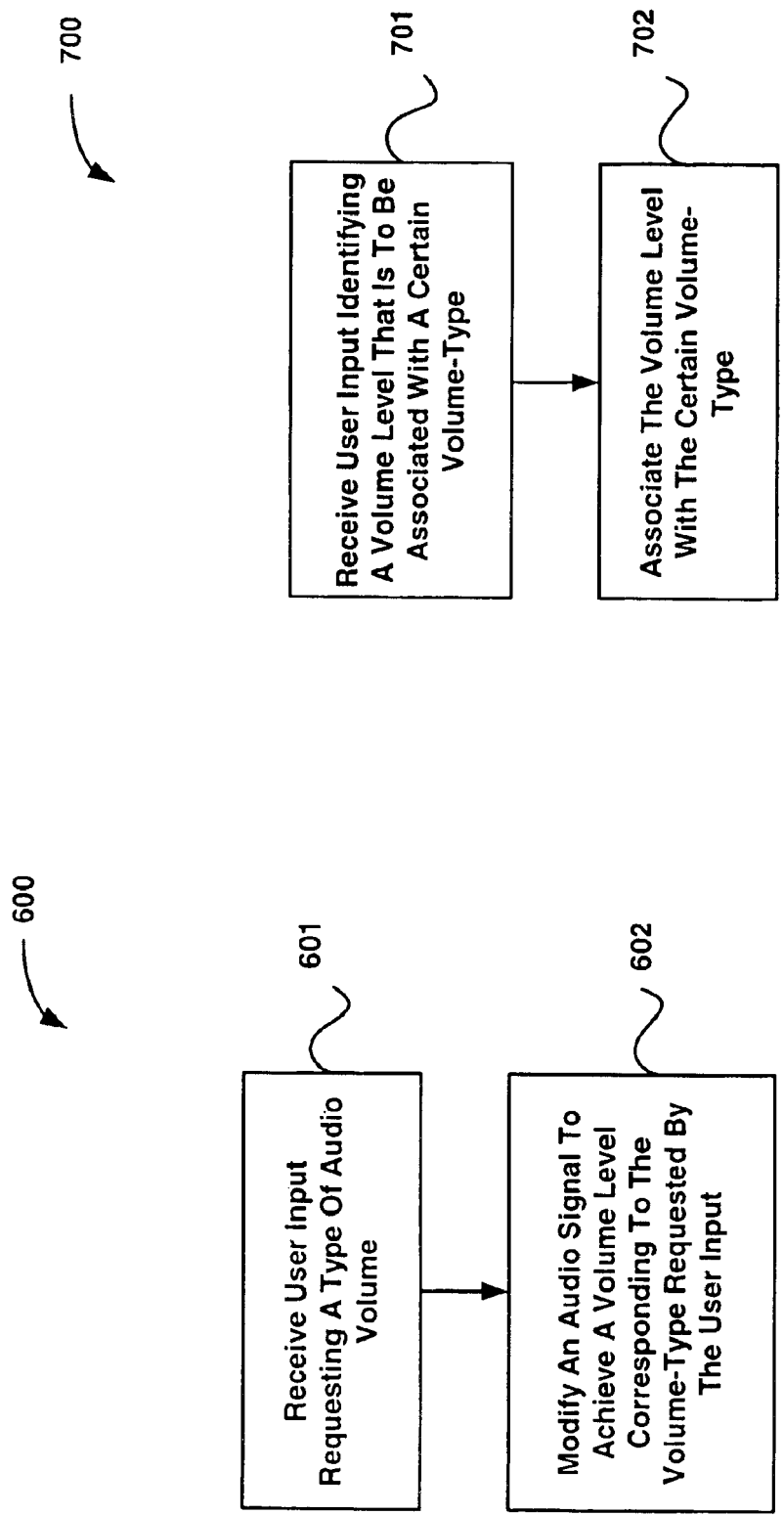

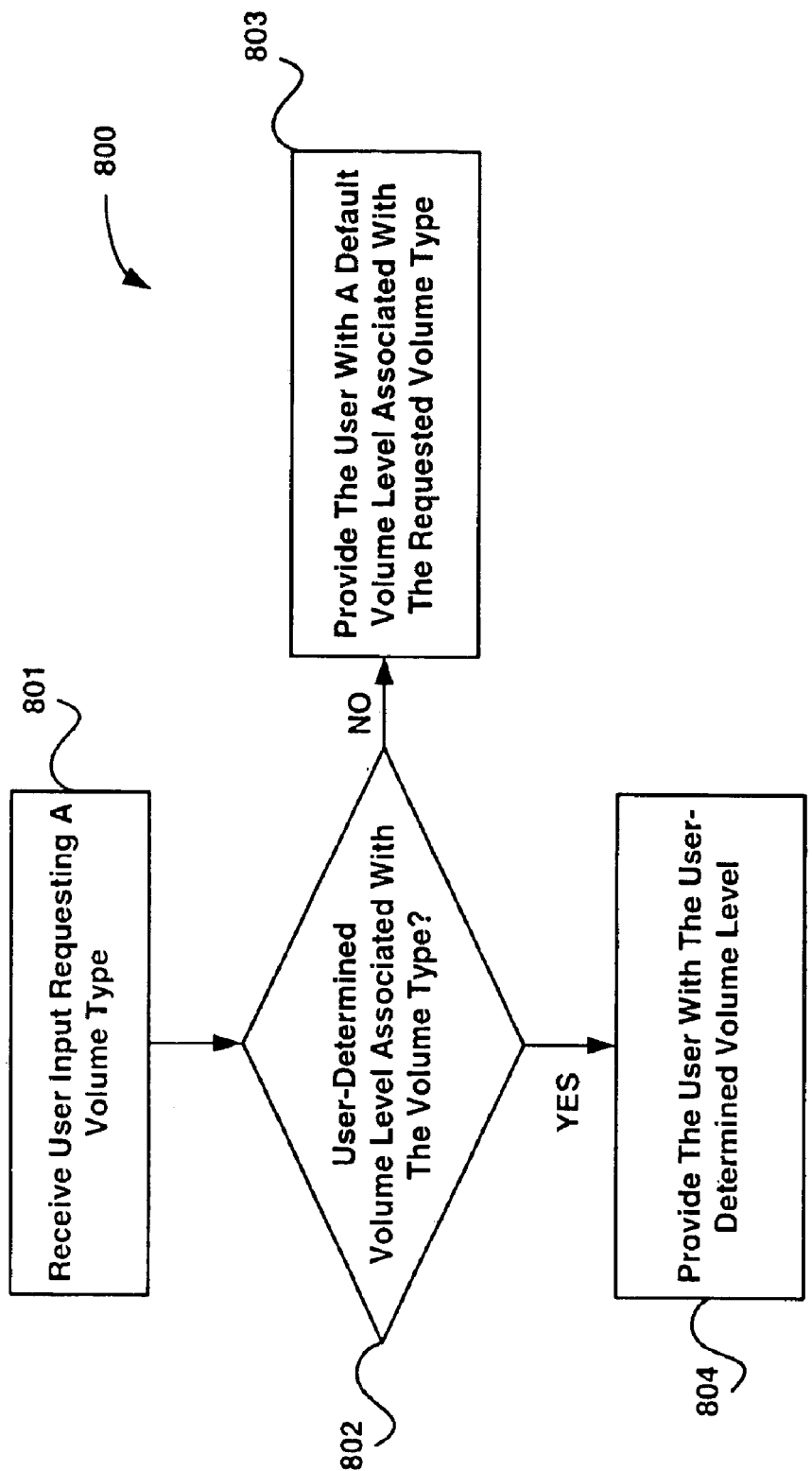

AUDIO VOLUME CONTROL

FIELD OF THE INVENTION

This invention relates in general to audio, and more particularly to audio volume control.

DESCRIPTION OF THE RELATED ART

Cable television systems are now capable of providing many services in addition to analog broadcast video. In implementing enhanced programming, the home communication terminal ("HCT"), otherwise known as the set-top box, has become an important computing device for accessing various video services. In addition to supporting traditional analog broadcast video functionality, digital HCTs (or "DHCTs") now also support an increasing number of two-way digital services such as video-on-demand.

A DHCT is typically connected to a communications network (e.g., a cable or satellite television network) and includes hardware and software necessary to provide various services and functionality. Preferably, some of the software executed by a DHCT is downloaded and/or updated via the communications network. Each DHCT also typically includes a processor, communication components and memory, and is connected to a television or other display device. While many conventional DHCTs are stand-alone devices that are externally connected to a television, a DHCT and/or its functionality may be integrated into a television or other device, as will be appreciated by those of ordinary skill in the art.

A DHCT is typically configured to output a user-requested television service (e.g., a television channel) to a television. As a user navigates from one television service to another, the audio volume level that is output by the television may change even though the volume setting (which may be on a scale of, for example, 0–63) remains unchanged. This non-requested change in volume level is undesirable as it can result in a user having to adjust the volume setting in order to maintain a desirable volume level after the user is presented with another television service. Therefore, there exists a need for systems and methods for addressing this and/or other problems associated with providing audio volume levels.

BRIEF DESCRIPTION OF THE DRAWINGS

The invention can be better understood with reference to the following drawings. The components in the drawings are not necessarily drawn to scale, emphasis instead being placed upon clearly illustrating the principles of the present invention. In the drawings, like reference numerals designate corresponding parts throughout the several views.

FIG. 6 is a flow chart illustrating a method for adjusting volume levels according to one embodiment of the invention.

FIG. 7 is a flow chart illustrating a method for adjusting volume levels according to one embodiment of the invention.

FIG. 8 is a flow chart illustrating a method for adjusting volume levels according to one embodiment of the invention.

DETAILED DESCRIPTION OF THE PREFERRED EMBODIMENTS

In one embodiment of the invention, a digital home communication terminal (DHCT) receives user input requesting a volume-type, and in response to receiving the user input, modifies an audio signal in order to help achieve a volume level associated with the requested volume-type. This and other embodiments are described in more detail below in reference to the accompanying figures.

Figure 1:
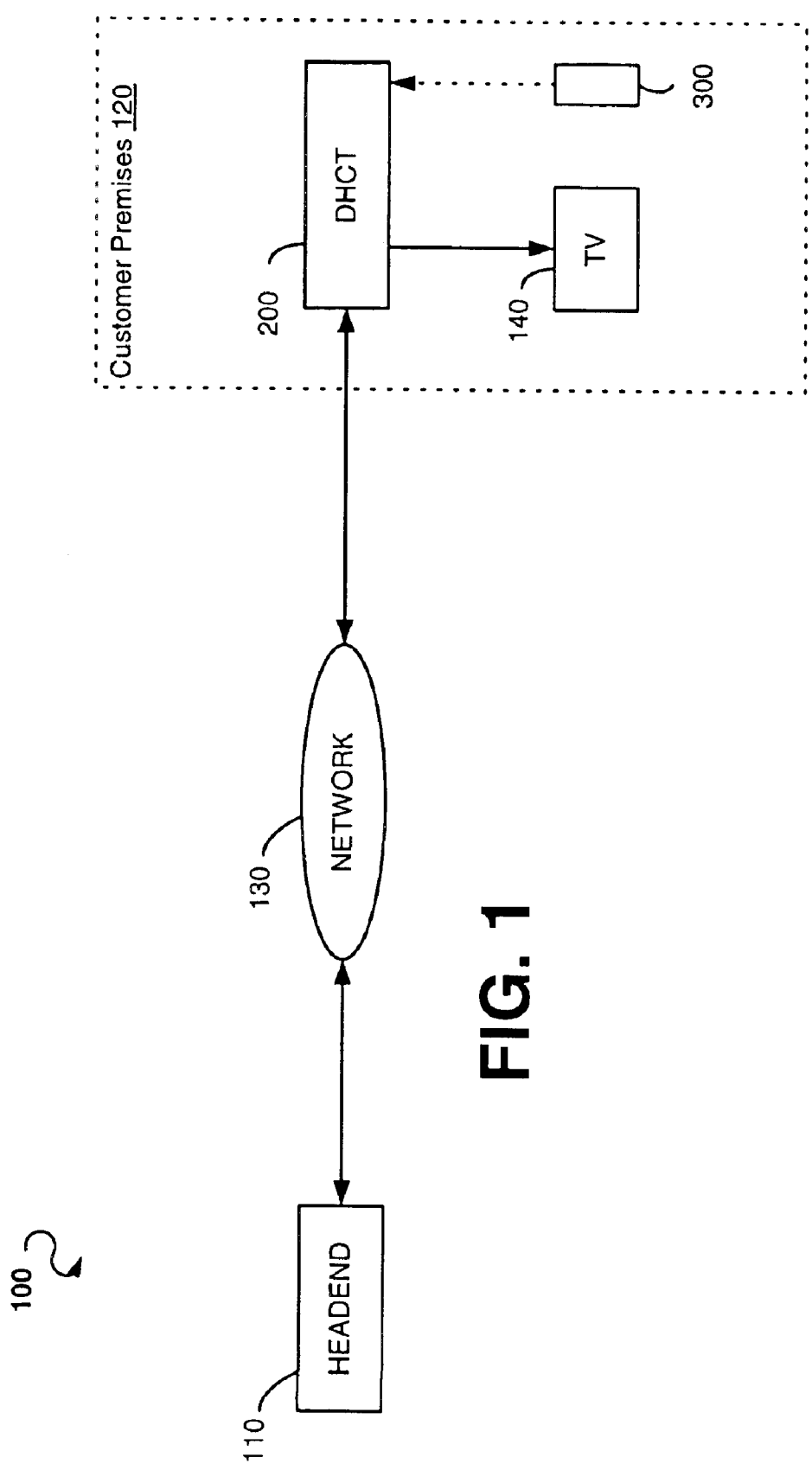
FIG. 1 is a block diagram depicting a non-limiting example of a subscriber television system in accordance with one embodiment of the invention.
Figure 5:
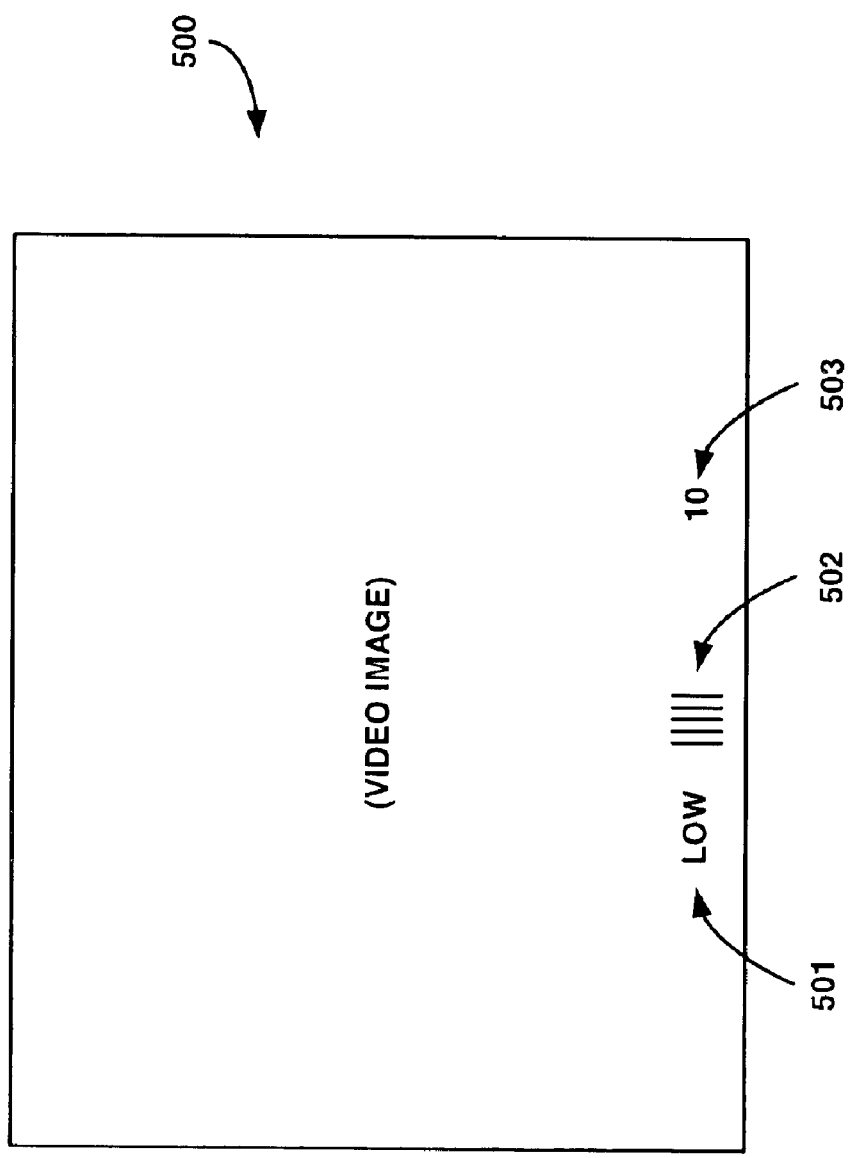
FIG. 5 depicts a screen that may be presented to a user in response to a request for a volume-type.
Figure 11:
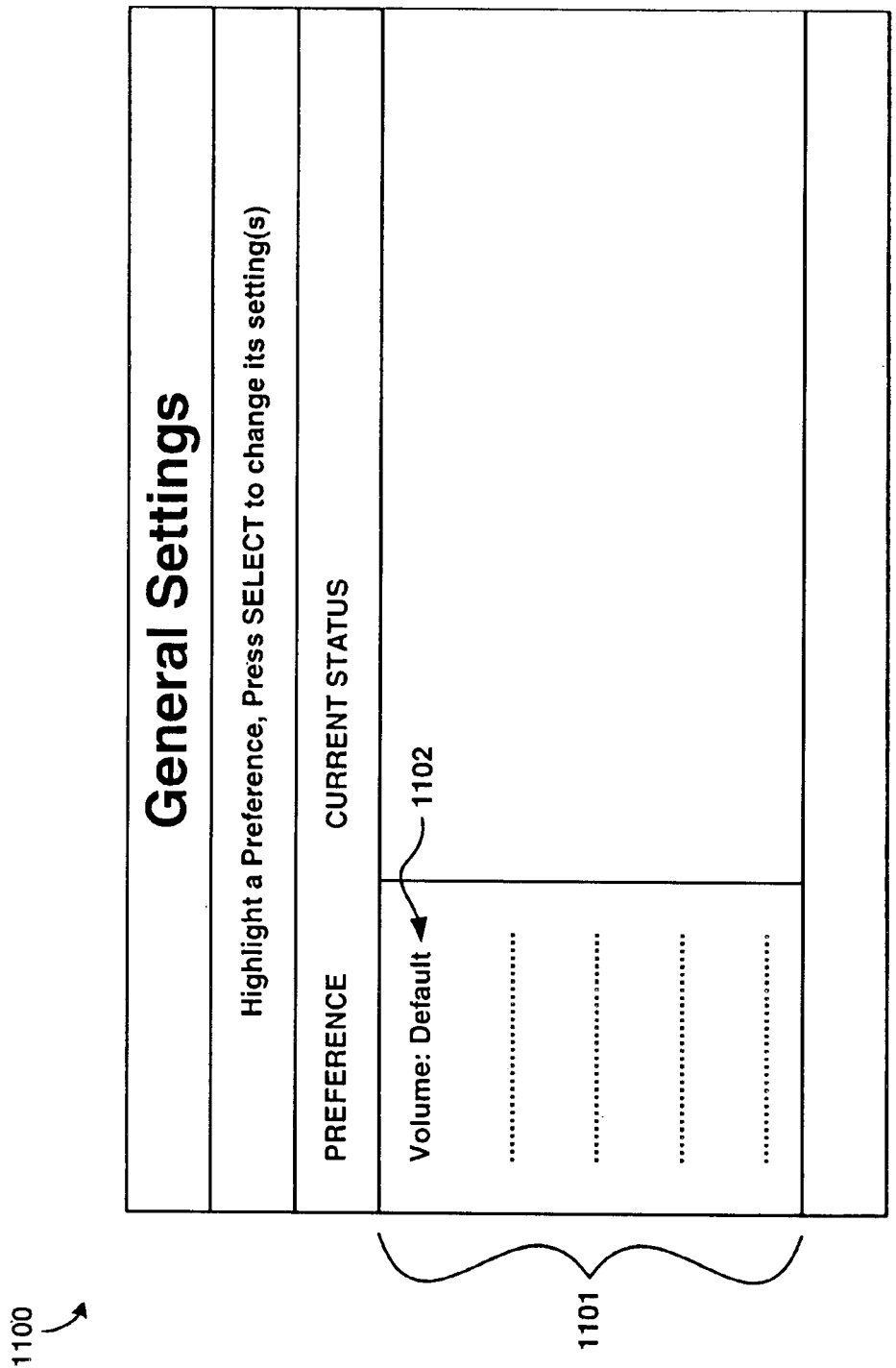
FIG. 11 is a schematic diagram depicting a non-limiting example of a General Settings screen, according to one embodiment of the invention.
Figure 12:
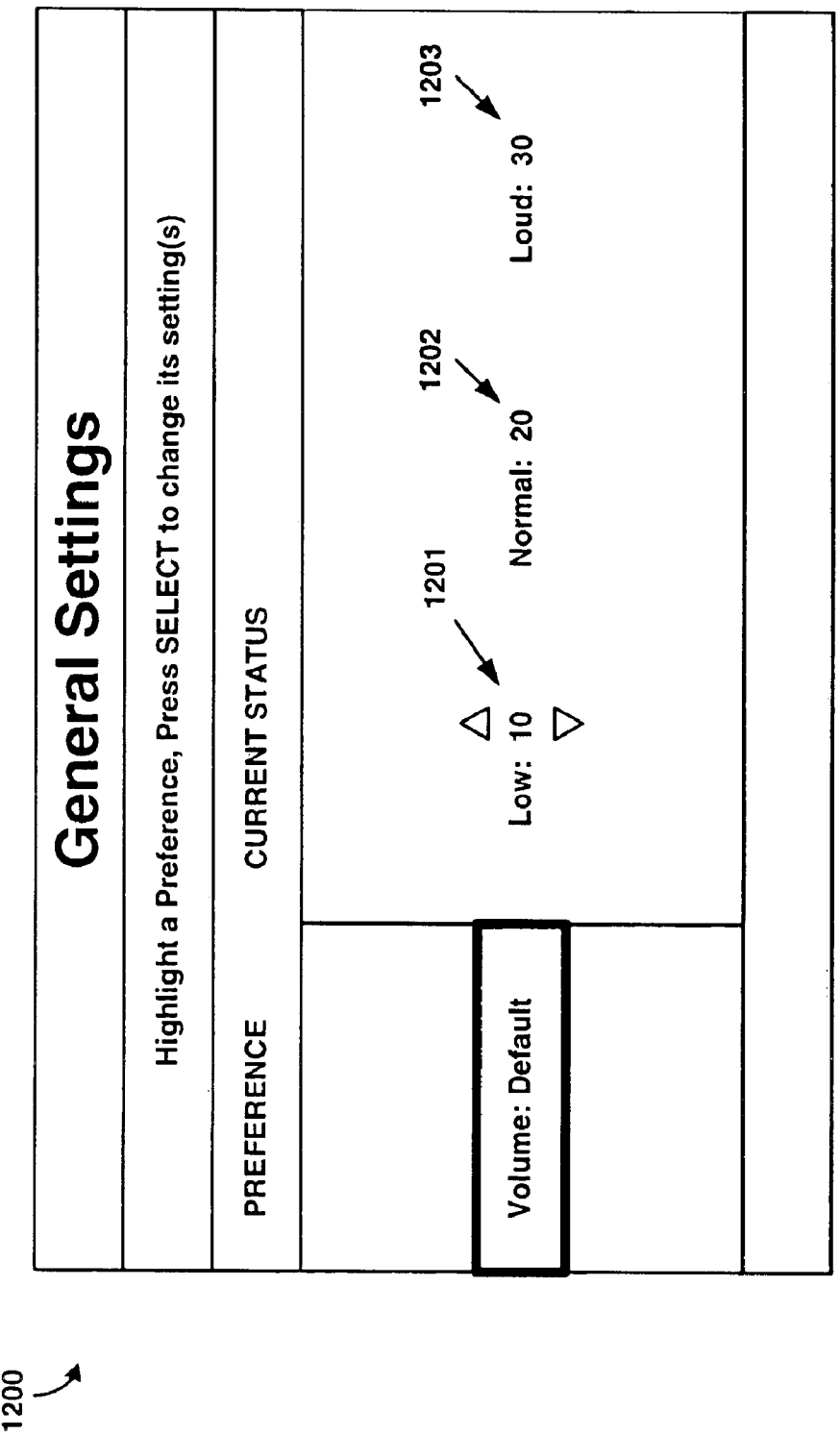
FIG. 12 is a schematic diagram depicting a non-limiting example of a General Settings screen that may be used to modify default volume level settings, according to one embodiment of the invention.

FIGS. 1–10 provide examples of system and methods of the present invention: FIG. 1 provides an example of a system in which an embodiment of the present invention may be implemented; examples of system components that may be used to help implement volume control are illustrated in FIGS. 2–4 and 9–10; examples of user interface screens that may be presented during a volume control process are illustrated in FIGS. 5, 11, and 12; and examples of methods for implementing volume control are illustrated in the flow charts of FIGS. 6–8. Note, however, that the invention may be embodied in many different forms and should not be construed as limited to the embodiments set forth herein. Furthermore, all examples given herein are intended to be non-limiting, and are provided in order to help clarify the description of the invention.

Reference is now made to FIG. 1, which is a block diagram depicting a non-limiting example of a subscriber television system (STS) 100 in accordance with one embodiment of the invention. In this example, the STS 100 includes a headend 110 and a DHCT 200 that are coupled via a communication network (CN) 130. The CN 130 may be, for example, a hybrid fiber coax (HFC) network, a satellite communications network, a public switched telephone network (PSTN), or the Internet, among others. The DHCT 200 is typically situated at a customer premises 120, and may be a stand-alone unit or integrated into another device such as, for example, a television (TV) 140. The customer premises 120 may be a user's residence or place of business.

The DHCT 200 receives signals (video, audio and/or other data) from the headend 110 through the CN 130. The DHCT 200 may also use the CN 130 to provide upstream messages to the headend 110. A remote control device 150 may be used to provide user input to the DHCT 200. The remote control device 150 preferably provides user input via infra-red (IR) signals. However, the remote control device 150 may alternatively provide user input via other types of signals, such as, for example, wireless radio frequency (RF) signals. Other input devices (e.g., a keyboard or a mouse) may additionally or alternatively be used to provide user input.

The headend 110 may include one or more server devices (not shown) for providing video, audio, and other data to the DHCT 200 via the CN 130. The headend 110 and the DHCT 200 cooperate to provide a user with television services via the TV 140. The television services may include, for example, broadcast television services, video-on-demand (VOD) services, and/or pay-per-view (PPV) services, among others. Each television service typically corresponds to a television station (e.g., CNN) and is identified by a television channel number (e.g., channel 46).

Figure 2:
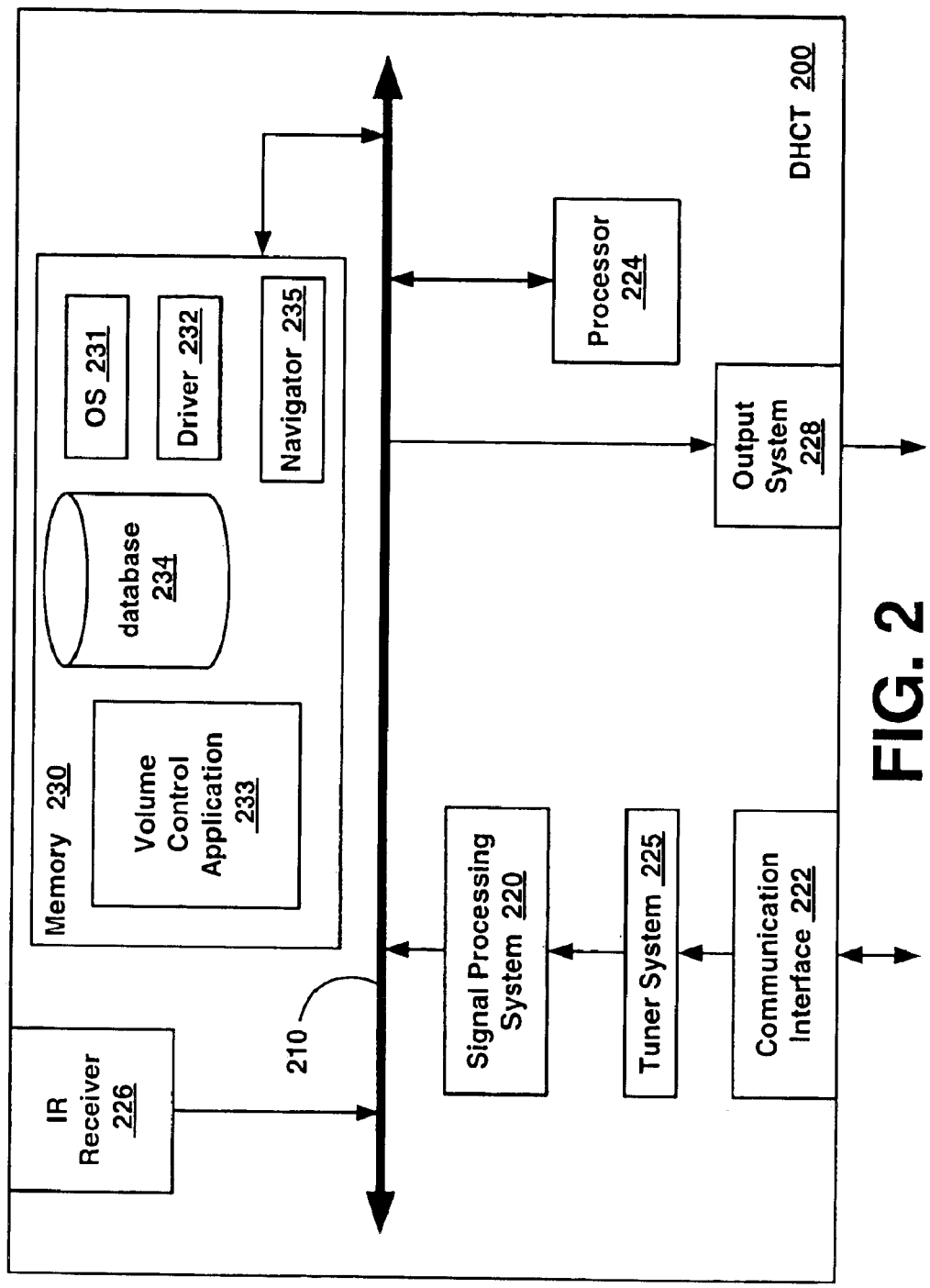
FIG. 2 is a simplified block diagram illustrating selected components of a DHCT according to one embodiment of the invention.

FIG. 2 is a simplified block diagram illustrating selected components of a DHCT 200 according to one embodiment of the invention, among others. The DHCT 200 includes a local interface 210 that is used to transfer data among DHCT 200 components. The local interface 210 may include, for example, one or more buses or other wired and/or wireless connections. As shown in FIG. 2, the DHCT 200 includes at least one processor 224 and memory system 230, among other components.

The processor 224 is a hardware device for executing software, particularly that stored in memory system 230. The processor 224 can be a custom-made or a commercially available processor for executing software instructions. When the DHCT is in operation, the processor 224 is configured to execute software stored within the memory system 230, to communicate data to and from the memory system 230, and to generally control operations of the DHCT 200 pursuant to the software.

The memory system 230 may include any one or combination of volatile memory elements (e.g., random access memory (RAM), dynamic RAM (DRAM), static RAM (SRAM), synchronous DRAM (SDRAM), magnetic RAM (MRAM), etc.) and nonvolatile memory elements (e.g., read only memory (ROM), hard drive, tape, compact disk ROM (CD-ROM), etc.). Moreover, the memory system 230 may incorporate electronic, magnetic, optical, and/or other types of storage media. Note that the memory system 230 can have a distributed architecture, where various memory components are situated remotely from one another, but can be accessed by the processor 224.

Software residing in memory system 230 may include one or more separate programs, each of which comprises executable instructions for implementing logical functions. In the example of FIG. 2, the software in the memory system 230 includes an operating system (OS) 231, a navigator application 235, a driver 232, and a volume control application 233. The volume control application 233 may be implemented as a discrete application, or may be part of another application, such as, for example, the navigator application 235 or the OS 231. Other software applications may be included in memory system 230 but are omitted from FIG. 2 to simplify the illustration of the DHCT 200.

The OS 231 controls the execution of other software and provides management and control services including, for example, scheduling, input-output control, file and data management, memory management, and communication control, among others. The navigator 235 is used to route user input commands to respective software applications that have registered with the navigator 235 to receive the commands. The volume control parameters database stores volume control settings that are used to determine the volume levels corresponding to respective volume-types. The volume control application 233 is responsible for providing a volume level corresponding to a volume-type that is requested by a user. The volume control application 233 provides a volume level by communicating with a driver 232. The driver 232 controls the operation of a volume control module (not shown in FIG. 2) that may be located, for example, in the signal processing system 220 or in the output system 228. The driver 232 may operate based on instructions provided by the volume control application 233.

The tuner system 225 includes, in one implementation, an out-of-band tuner for receiving out-of-band signals that were modulated using quadrature phase shift keying (QPSK), and an in-band quadrature amplitude modulation (QAM)/analog tuner for receiving analog and digital television services. The signal processing system 220 may be capable of demodulating, demultiplexing, and decoding signals that are tuned to by the tuner system 225. Although shown as one module, the signal processing system 220 may comprise multiple modules that are located in different parts of the DHCT 200.

The DHCT 200 also includes an IR receiver 226 which detects IR signals that encode remote control commands requesting television services or DHCT functionality. Remote control commands that are detected by the IR receiver 226 may be forwarded to the navigator application 235, which routes the commands to respective software applications.

The output system 228 is used to perform analog-to-digital conversion on television service data that are to be output to the TV 140-1. The output system 228 may provide the TV 140-1 with signals that are in, for example, NTSC (National Television Standard Committee) format. In an alternative embodiment, if the TV 140-1 is a digital television (e.g., an HDTV), then the output system 228 may include an MPEG (Motion Picture Experts Group) encoder for encoding television service data in an MPEG-2 format.

Figure 3:
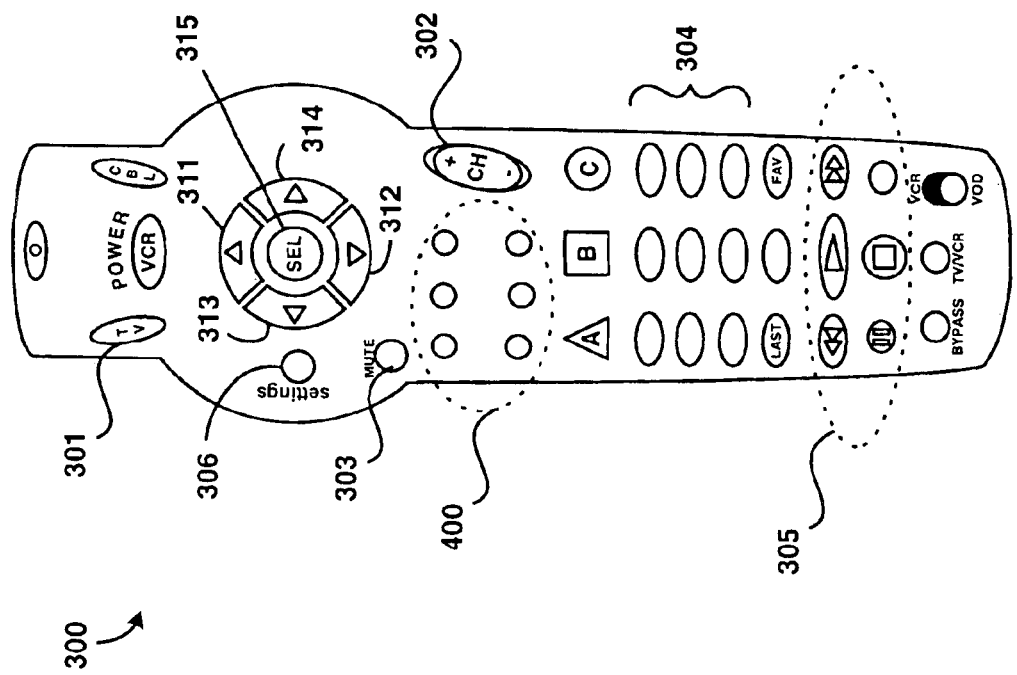
FIG. 3 is a schematic diagram depicting a non-limiting example of a remote control device that may be used to provide user input to the DHCT and/or to the TV illustrated in FIG. 1.
Figure 4:
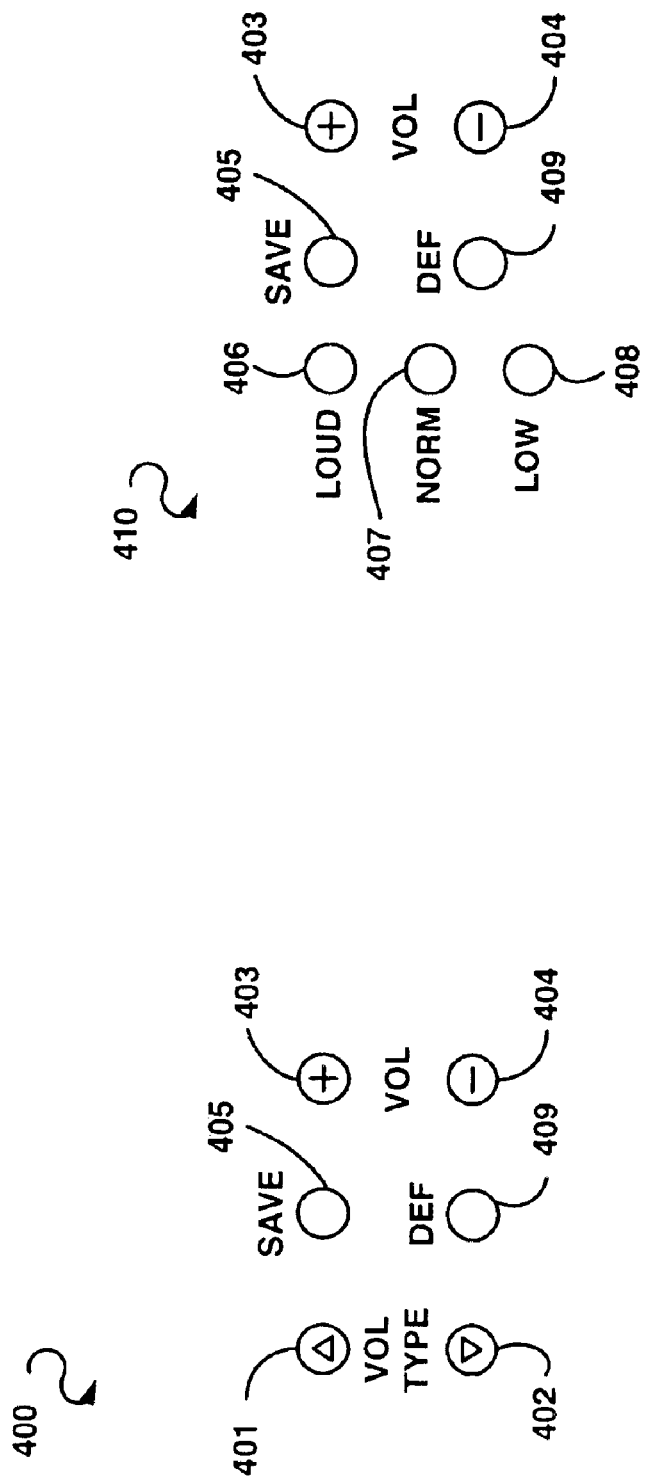
FIG. 4A is a schematic diagram illustrating remote control keys that may be used to control the audio volume level for television services that are presented by the television illustrated in FIG. 1.
FIG. 4B is a schematic diagram illustrating remote control keys that, as a whole, represent an alternative embodiment to the remote control keys illustrated in FIG. 4A.

FIG. 3 is a schematic diagram depicting a non-limiting example of a remote control device 300 that may be used to provide user input to the DHCT 200 and/or to the TV 140 (FIG. 1). Note that the remote control device 300 is merely illustrative and is not intended to imply any limitations of the scope of the present invention. The remote control device 300 may use an LED (light-emitting diode (not shown)) to generate patterns of IR pulses corresponding to respective remote control keys.

As shown in FIG. 3, the remote control device 300 includes a TV power key 301, a channel up/down key 302, a mute key 303, number keys 304, arrow keys 311–314, a select key 315, and video control keys 305, among others. The TV power key 301 may be used for turning on the TV 140 (FIG. 1). The channel up/down key 302 may be used to request an incrementally higher or lower numbered television channel than the currently displayed television channel. The video control keys 305 may be used to control the functionality of a video cassette recorder (VCR) or provide trick-mode functionality in connection with a video-on-demand (VOD) presentation. The arrow keys 311–314 may be used to scroll through on-screen options and/or to highlight a desired option. The select key 315 may be used to select a highlighted on-screen option. The mute key 303 may be used to mute the audio volume associated with a television presentation.

The remote control device 300 also includes other volume control keys 400 that can be used to manipulate the volume of a television service, as described in more detail below. Note that the remote control device 300 may alternatively include fewer, different, and/or additional keys than illustrated in FIG. 3.

FIG. 4A is a schematic diagram illustrating remote control keys 400 that may be used to control the audio volume level for television services that are output by the DHCT 200 and presented by the television 140 (FIG. 1). The remote control keys 400 may be configured to provide user input to the DHCT 200 and/or to the television 140 depending on a desired implementation. The keys 400 may be included on the exterior of a remote control device 150 (FIG. 1) that is used to provide user input commands to the DHCT 200. The keys 400 include volume-type-selection keys 401 & 402, gradual-volume-modification keys 403 & 404, a default key 409, and a save key 405.

The volume-type selection keys 401 and 402 may be used to select a volume-type. In a preferred embodiment, one of three volume-types may be selected. The volume-types may be, for example, "low," "normal," and "loud." Other names or labels may alternatively be used to identify the volume-types including, for example, among others, "low," "medium," and "high." Furthermore, fewer or additional volume types may be available. As a non-limiting example, the available volume types may be "very low," "low," "normal," "loud," and "very loud."

The volume-type selection key 401 may be used to select a louder volume-type, if available, than a currently provided volume-type. The volume-type selection key 402, on the other hand, may be used to select a quieter volume-type, if available, than a currently provided volume-type. For example, if the current volume-type is "low," then activating key 401 may first result in the provision of a volume level corresponding to a "normal" volume-type that is substantially louder than the "low" volume-type, and re-activating key 401 may result in the provision of a volume level corresponding to a "loud" volume-type that is substantially louder than the "normal" volume-type. A volume level may be considered to be substantially louder if, for example, it corresponds to volume setting that is at least 5 points higher on a scale of 0–63.

Note that a television presentation that is presented at a certain volume level will typically include audio data that is played at varying sound intensity levels. As a non-limiting example, when a certain television presentation is played at a certain volume level, a scene depicting a verbal conversation may include audio data that is played at 60 decibels (dB), whereas a scene depicting explosions may include audio data that is played at 90 dB. In the context of sound, decibels are defined in terms of power per unit surface area on a scale from the threshold of human hearing, 0 dB, upward towards the threshold of pain, about 120–140 dB. A first volume level may be considered to be louder than a second volume level if, for a given television presentation, in accordance with one example, among others, the average sound intensity level that results from presenting the television presentation at the first volume level is higher than the average sound intensity level that results from presenting the same television presentation at the second volume level.

The gradual-volume-modification keys 403 and 404 may be used to gradually modify a current volume level. For example, if the current volume level corresponds to a volume setting of "10" (e.g., on a scale of 0–63), then activating key 403 may first result in the provision of a slightly louder volume level that corresponds to a volume setting of "11," and re-activating (or continuing to activate) key 403 may then result in an even louder volume level that corresponds to a volume setting of "12," and so forth.

A user may activate a volume-type selection key 401 or 402 and/or a gradual-volume-modification key 403 or 404 in order to achieve a desired volume level (e.g., as determined by a user's auditory perception). Once a desired volume level is achieved, then the save key 405 may be pressed in order to associate the user-selected volume level with the user-selected volume-type.

After a user-selected volume level is associated with a certain volume-type, then the user-selected volume level may be presented to a user in response to a subsequent request for such volume-type. For example, if a user-selected volume level corresponding to a volume setting of "15" is associated with a low volume-type, then such volume level (15) may be provided to a user in response to a subsequent request for a low volume-type. Furthermore, after a user-selected volume level is associated with a certain volume-type, then a user may request a default volume level associated with such volume type by first requesting the volume type (e.g., via key 401 or key 402), and by then activating the default key 409. A default volume level may be a volume level that was capable of being presented to a user prior to the association of a user-selected volume level with a certain volume-type, in response to a selection of such volume-type. Furthermore, a default volume level may be a level that is set by a television service provider and/or by a DHCT user. After a volume-type and a default volume level are selected, then the default volume level may be designated as corresponding to the requested volume type by activating the save key 405. Once a default volume level is designated as corresponding to a certain volume-type, then a subsequent request for such volume-type may result in the provision of the default volume level.

Associating a user-selected volume level with a user-selected volume-type may be achieved by storing and/or modifying one or more volume control parameters in a database 234 (FIG. 2). A volume control parameter may be any data entry that enables the DHCT 200 to provide (via the TV 140) a certain volume level. A volume control parameter may or may not have any meaning outside the context of the DHCT 200's internal operations. Volume control parameters that may have meaning outside the context of the DHCT's internal operations may include, for example, television volume settings (e.g., on a scale of 0–63). Other volume control parameters that may be associated with respective volume levels including for example, audio signal amplification or attenuation levels required to achieve certain volume levels. The following tables illustrate non-limiting examples, among others, of volume control parameters that may be stored in database 234.

TABLE 1

Volume Settings Used as Volume Control Parameters

| Volume-type | Volume Setting (Scale of 0–63) |
| --- | --- |
| Low | 10 |
| Normal | 25 |

TABLE 1-continued

Volume Settings Used as Volume Control Parameters

| Volume-type | Volume Setting (Scale of 0–63) |
|---|---|
| Loud | 40 |

TABLE 2

Audio Signal Amplification Levels Used as Volume Control Parameters

| Volume-type | Audio Signal Amplification Level |
|---|---|
| Low | 10× |
| Normal | 20× |
| Loud | 30× |

In one embodiment, a user-selected volume level may be associated with a user-selected volume-type on a per-channel basis. For example, a volume-type "low" may be associated with a volume setting of "10" in connection with a first television channel, but may be associated with a volume setting of "12" in connection with a second television channel. The following tables illustrate non-limiting examples, among others, of volume control parameters (that may be stored in database 234) corresponding to respective volume-types and television channels.

TABLE 3

Volume Settings for Respective Channels and Volume Types

| Volume-type | Volume Setting For Channel 2 | Volume Setting For Channel 4 | Volume Setting For Channel 5 |
|---|---|---|---|
| Low | 10 | 10 | 9 |
| Normal | 25 | 26 | 25 |
| Loud | 40 | 41 | 39 |

TABLE 4

Amplification Levels for Respective Channels and Volume Types

| Volume-type | Audio Signal Amplification Level For Channel 2 | Audio Signal Amplification Level For Channel 4 | Audio Signal Amplification Level For Channel 5 |
|---|---|---|---|
| Low | 10× | 11× | 10× |
| Normal | 20× | 21× | 20× |
| Loud | 30× | 30× | 29× |

When a user-selected volume level is associated with a user-selected volume-type on a per-channel basis, then selecting a certain volume-type may, in one implementation, result in a corresponding volume level that is automatically adjusted in response to a subsequent change in television channels. The volume level may be adjusted based on, for example, a volume control parameter corresponding to the newly presented television channel and to the selected volume-type.

In yet another embodiment, a user-selected volume level may be associated with a user-selected volume-type and a user-selected service. The user selected service may include, for example, a sequence of broadcast television presentations that are provided by a certain television station. Non-limiting examples of television services include, a CNN service (e.g., Headline News), an American Broadcasting Company (ABC) service, and a British Broadcasting Corporation (BBC) service (e.g., BBC One), among others. In this manner, even if a channel map associating television services with channel numbers is altered, a user-selected volume level may continue to be associated with a user-selected service.

FIG. 4B is a schematic diagram illustrating remote control keys 410 that, as a whole, represent an alternative embodiment to the remote control keys 400 (FIG. 4A). The keys 410, which may part of the remote control device 150 (FIG. 1), include volume-type-selection keys 406–408, gradual-volume-modification keys 403 and 404, a default key 409, and a save key 405.

The volume-type selection keys 406, 407, and 408 may be used to select a respective volume-type; activating key 406 may be used to request a "loud" volume-type, activating key 407 may be used to request a "normal" volume-type and activating key 408 may be used to request a "low" volume-type. In response to a request for a volume-type, the DHCT 200 may output an audio signal that has a volume level that is associated with the selected volume-type.

The gradual-volume-modification keys 403 and 404 may be used in the same general manner as discussed above in relation to FIG. 4A. A user may activate a volume-type selection key 406, 407, or 408 and/or a gradual-volume-modification key 403 or 404 in order to achieve a desired volume level. Once a desired volume level is achieved, then associating the user-selected volume level with the user-selected volume-type may be achieved by, for example: (a) activating the save key 405 after both the volume level and volume-type have been specified or (b) activating (consecutively or concurrently) the save key 405 and a volume-type selection key 406, 407, 408 after the volume level has been specified.

FIG. 5 depicts a screen 500 that may be presented to a user in response to a request for a volume-type. The screen 500 includes a volume-type indication 501, a graphical volume-setting indication 502, and a numerical volume-setting indication 503 that overlay a television presentation 504. The volume-type indication 501 indicates the currently selected volume-type, which in one embodiment may be "low," "normal," or "loud." In the example shown in FIG. 5, the volume-type indication 501 indicates that the requested volume-type is "low." The graphical volume-setting indication 502 provides a graphical representation of the current volume setting. In the current example, the graphical volume-setting indication 502 includes adjacent vertical lines, the number of which is correlated to the current volume level. The numerical volume-setting indication 503 is an integer that indicates the current volume setting, which is correlated to the current volume level for a given television channel. A volume setting may be represented, for example, by an integer between 0–63 inclusively. Other volume scales having other value ranges may alternatively be used in representing volume settings.

The graphical volume-setting indication 502 and the numerical volume-setting indication 503 may change in response to a change in the volume level. For example, the numerical volume-setting indication 503 may change from "10" to "11" in response to a an increase in volume level (e.g., as a result of activating key 403 (FIG. 4A)). Once a desired change in the volume level is achieved, the save key 405 (FIG. 4A) may then be used to associate the current volume level with the currently selected volume-type (as indicated by the volume-type indication 501). A current volume level may be associated with a volume-type based on the current volume setting (as indicated by the graphical volume-setting indication 502 and/or the numerical volume-setting indication 503). In other words, associating a volume setting or other volume-related parameter with a volume-type can result in associating a corresponding volume level with the volume-type.

FIG. 6 is a flow chart illustrating a method 600 for adjusting volume according to one embodiment of the invention. The method 600 may be implemented by, for example, the DHCT 200 and/or the TV 140 (FIG. 1). As indicated in step 601, a user input requesting a type of audio volume (e.g., low, normal, or loud volume) is received. In response to receiving the user input, an output audio signal is modified to achieve a volume level corresponding to the volume-type requested by the user input, as indicated in step 602. The volume level corresponding to a volume-type may be based on either a default setting or on a user-modified setting. Each volume-type may have a user-modified setting for each of a plurality of television channels. To achieve a desired volume level, an output audio signal may be amplified or attenuated using systems and methods now known or later developed. As a non-limiting example, an output audio signal may be amplified using an amplifier with variable gain or may be attenuated using an attenuator with variable loss.

FIG. 7 is a flow chart illustrating a method 700 for adjusting volume levels according to one embodiment of the invention. The method 700 may be implemented by, for example, the DHCT 200 and/or the TV 140 (FIG. 1). Step 701 involves receiving a user input identifying a volume level that is to be associated with a certain volume-type. In response to receiving the user input, the volume level is associated with the certain volume-type, as indicated in step 702. A volume level may be associated with a certain volume-type by storing in memory (e.g., in the database 234 (FIG. 2)) a volume control parameter that can be used to help identify or produce the volume level in response to a future request for the certain volume-type. Note that the volume control parameters that are saved in the database 234 may be different than the volume settings (e.g., on a scale 0–63 ) that are used to identify the volume level to a viewer. For example, each volume control parameter may identify a level of attenuation or amplification for an audio signal, or some other parameter that can be used to help implement a corresponding volume-type. Once a user-selected volume level is associated with a certain volume-type, then such volume level may be provided to a user in response to a future request for the certain volume-type.

FIG. 8 is a flow chart illustrating a method 800 for adjusting volume according to one embodiment of the invention. The method 800 may be implemented by, for example, the DHCT 200 and/or the TV 140 (FIG. 1). The method 800 includes receiving user input requesting a volume-type, as indicated in step 801. Then, as indicated in step 802, a determination is made as to whether a user-determined volume level has been previously associated (responsive to user input) with the requested volume-type. If a user-determined volume level has not been associated with the requested volume-type, then a default volume level associated with the requested volume-type is provided to the user, as indicated in step 803. However, if a user-determined volume level has been associated with the requested volume-type, then such volume level is provided to the user, as indicated in step 804. In one embodiment, the method 800 is performed on a per-channel basis. In other words, in step 802 a determination is made as to whether a volume level has been previously associated (responsive to user input) with the requested volume-type in connection with a currently displayed television service.

The steps shown in FIGS. 6–8 may be implemented by modules, segments, or portions of code which include one or more executable instructions. The functionality provided by the methods illustrated in FIGS. 6–8, may be embodied in any computer-readable medium for use by or in connection with a computer-related system or method. In this context of this document, a computer-readable medium is an electronic, magnetic, optical, semiconductor, or other physical device or means that can contain or store a computer program or data for use by or in connection with a computer-related system or method. Furthermore, the functionality provided by the methods illustrated in FIGS. 6–8 may be implemented through hardware (e.g., an application specific integrated circuit (ASIC) and supporting circuitry) or a combination of software and hardware.

Figure 9:
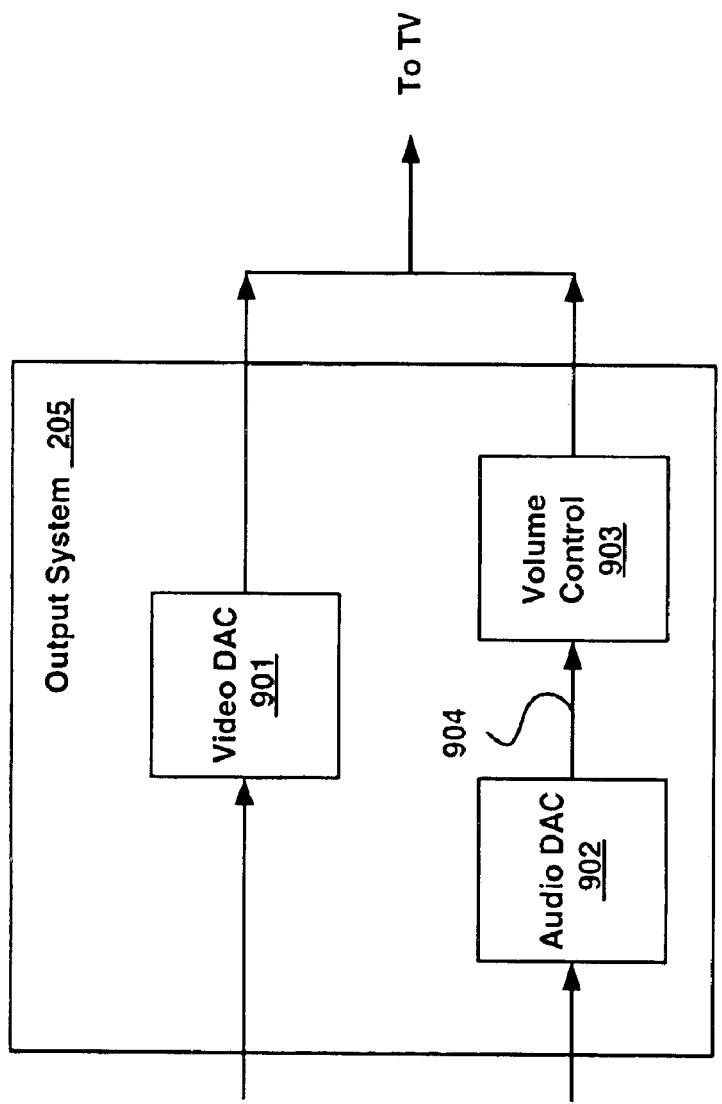
FIG. 9 is a simplified block diagram depicting an output system according to one embodiment of the invention.

FIG. 9 is a simplified block diagram depicting an output system 205 according to one embodiment of the invention. The output system 205 includes a video digital-to-analog converter (DAC) 901 and an audio DAC 902. The video DAC 901 converts digital video signals into analog video signals that are in a format (e.g., NTSC (National Television Standard Committee)) that is suitable for the TV 140 (FIG. 1). The Audio DAC 902 converts digital audio signals into analog audio signals that can be decoded and played by the TV 140. A volume control module 903 modifies the amplitude of the output 904 of the audio DAC in order to control the volume of the audio that is played by the TV 140. The volume control module 903 can modify the amplitude of the output 904 by using, for example, an amplifier with variable gain or an attenuator with variable loss. Note that the functionality of the volume control module 903 and the audio DAC 902 may alternatively be achieved by a single module. Furthermore, many alternative systems now known or later developed may be used to modify the amplitude of audio signals that are output by the DHCT 200.

Figure 10:
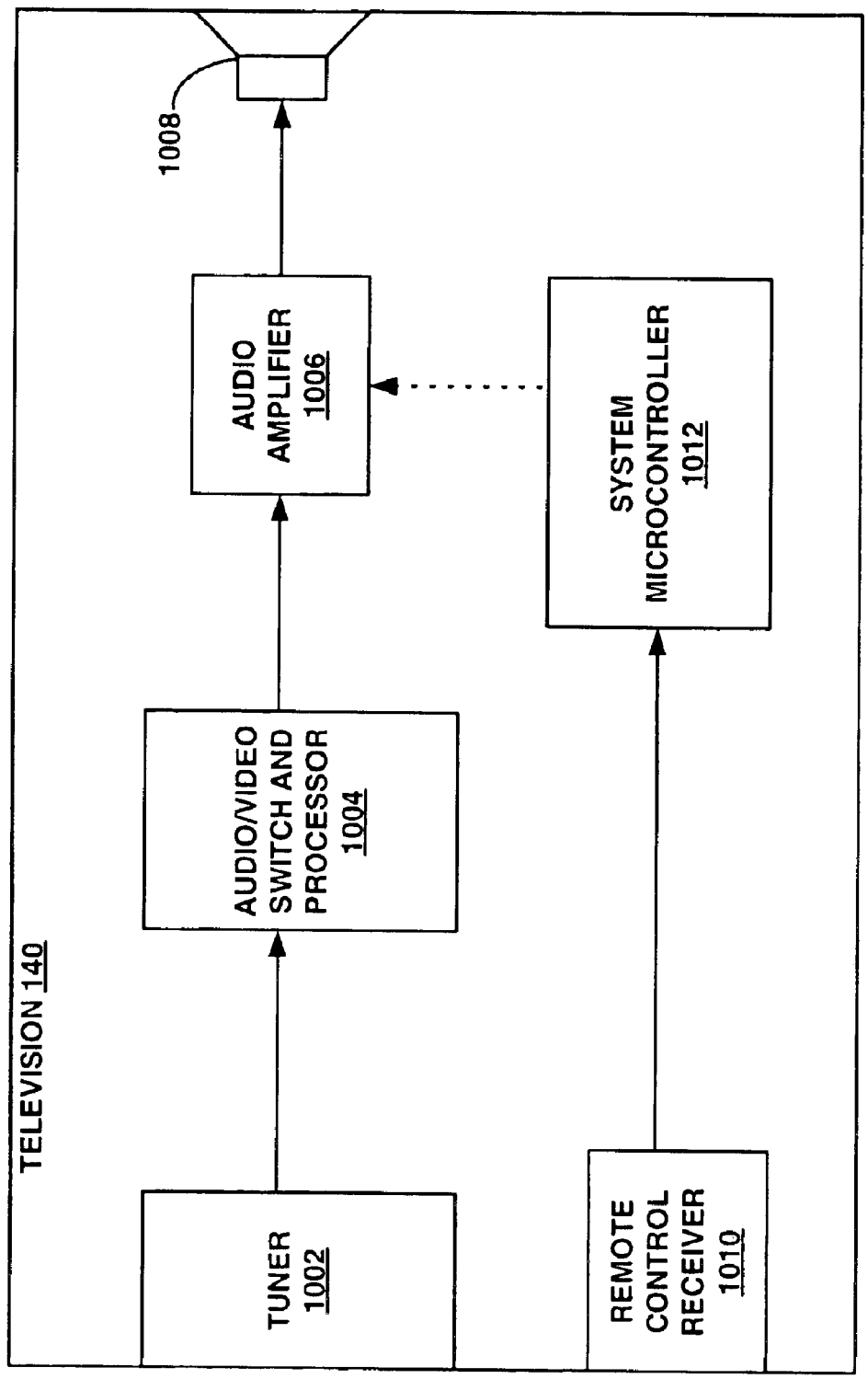
FIG. 10 is a simplified block diagram depicting selected modules of the TV depicted in FIG. 1, according to one embodiment of the invention.

FIG. 10 is a simplified block diagram depicting selected modules of the TV 140 according to one embodiment of the invention. The TV 140 also includes other modules (e.g., a display screen, a voltage supply, etc.) that are not shown in order to simplify the illustration of relevant modules. As shown in FIG. 10, the TV 140 includes a tuner 1002, an audio/video switch and processor ("AVSP") 1004, an audio amplifier 1006, a speaker 1008, a receiver 1010, and a system microcontroller 1012.

The tuner 1002 receives an RF signal either from the DHCT 200 or from another source, such as, for example, a satellite receiver or an antenna, among others. The tuner 1002 extracts audio and video signals from the received RF signal and forwards the extracted audio and video signals to the AVSP 1004.

The AVSP 1004 works as a switching device that controls the flow of video and audio signals to and from other components. The AVSP 1004 may also process video signals to produce video, color, and sync data. Audio signals that are received by the AVSP 1004 are forwarded to the audio amplifier 1006 where they are amplified.

The audio amplifier 1006 may be a variable gain amplifier that is used to control the volume level produced by the speaker 1008. The audio amplifier 1006 may operate based on control signals received from the system microcontroller 1012. In a preferred embodiment, the TV 140 includes at least two speakers 1008 that enable the provision of stereo sound.

The receiver 1010 converts infrared (IR) pulses received from the remote control device 300 (FIG. 1) and converts them to electrical pulses that are suitable for use by the system microcontroller 1012. The receiver 1010 preferably includes a phototransistor and an amplifier circuit (not shown). The receiver 1010 receives IR pulses from the remote control device 300 and converts the IR pulses into electrical signals, which are then amplified and forwarded to the system microcontroller 1012.

The system microcontroller 1012 is a dedicated microcomputer designed to control other components of the TV 140. In one embodiment, the microcontroller includes the following components (not shown): a processor, ROM, RAM, a clock, and an input/output control unit. The system microcontroller 1012 may receive a volume control command via the receiver 1010 and may cause the audio amplifier 1006 to amplify an audio signal by a magnitude that is calculated to result in the requested volume level being output by the speaker 1008.

FIG. 11 is a schematic diagram depicting a non-limiting example of a General Settings screen 1100 according to one embodiment of the invention. The General Settings screen 1100 may be provided in response to certain user input, such as, for example, the activation of the settings key 306 (FIG. 3). As shown in FIG. 11, the General Settings screen 1100 includes a list of options 1101, including a volume option 1102 that may be selected by a user in order to be provided with a screen that can be used to help select default volume levels for one or more volume-types.

The list of options 1101 may also include other options (not shown) for specifying STT settings such as, for example, an option for specifying favorite television services, an option for specifying services to be blocked, an option for setting a VCR timer, and/or an option for canceling a VCR timer, among others. A user may request a desired option from the list of options 1101 by providing user input via, for example, among others, the remote control device 300 (FIG. 3). As a non-limiting example, a user may use the up arrow key 311 or the down arrow key 312 to highlight a desired option, and may then use the select key to request the highlighted option.

FIG. 12 is a schematic diagram depicting a non-limiting example of a General Settings screen 1200 according to one embodiment of the invention. The General Settings screen 1200 may be provided in response to, for example, the selection of the volume option 1102 from the General Settings screen 1100 (FIG. 11). As shown in FIG. 12, the General Settings screen 1200 includes default volume level indicators 1201, 1202, 1203 that indicate the default settings for low, normal, and loud volume types, respectively. A user may adjust the default settings by providing user input via, for example, among others, the remote control device 300 (FIG. 3).

In one embodiment, among others, a user may use the left arrow key 313 or the right arrow key 314 to select (e.g., to highlight) a desired volume level indicator, and may then use the up arrow key 311 or the down arrow key 312 to modify the corresponding default volume setting. As a non-limiting example, the user may activate the up arrow key 311 to increase the default volume setting that is indicated by the volume level indicator 1201 (and that corresponds to a low volume-type) from "10" to "15".

Once a volume level indicator indicates a desired default volume setting, then additional user input may be provided to confirm the selected default volume level. The additional user input may be provided by, for example, activating the select key 315 (FIG. 3). When a default volume level is changed via the General Settings screen 1200, then a corresponding volume control parameter stored in database 234 may be modified accordingly.

It should be emphasized that the above-described embodiments of the present invention are merely possible examples, among others, of the implementations, setting forth a clear understanding of the principles of the invention. Many variations and modifications may be made to the above-described embodiments of the invention without departing substantially from the principles of the invention. For example, the invention may be also be embodied in and/or implemented by a video cassette recorder (VCR) and/or a television, among others. All variations that may be made to the above-described embodiments of the invention without departing substantially from the principles of the invention are intended to be included herein within the scope of the disclosure and present invention and protected by the following claims. In addition, the scope of the present invention includes embodying the functionality of the preferred embodiments of the present invention in logic embodied in hardware and/or software-configured mediums.

What is claimed is:

1. A method for controlling an audio volume level that is output by a display device, comprising:

requesting a first television service;

adjusting the audio volume level to a first audible volume level;

receiving a first user input that facilitates associating the first television service with the first audible volume level;

responsive to receiving the first user input, establishing an association between the first volume level and the first television service; and responsive to requesting the first television service, providing the first television service to the display device and modifying an audio signal to achieve the first audible volume level that is associated with the first television service.

2. The method of claim 1, further comprising:

receiving a second user input that facilitates associating a second television service with a second audible volume level; and responsive to providing the second television service, modifying an audio signal to achieve the second audible volume level that is associated with the second television service.

3. The method of claim 1, wherein the method is implemented by a digital home communication terminal that is coupled to the display device.

4. A method for controlling an audio volume level that is output by a display device, comprising:

requesting a first television service;

adjusting the audio volume level to a first volume level;

receiving a first user input that facilitates associating the first television service with the first volume level;

responsive to receiving the first user input, establishing an association between the first volume level and the first television service;

receiving a second user input requesting the first television service; and responsive to receiving the second user input, providing the first television service and adjusting audio volume level to the first volume level that is associated with the first television service.

5. The method of claim 4, further comprising:
receiving a third user input that facilitates associating the second television service with the second volume level;
responsive to receiving the third user input, establishing an association between the second volume level and the second television service;
receiving a fourth user input requesting the second television service;
responsive to receiving the fourth user input, providing the second television service to the display device and adjusting audio volume level to the second volume level that is associated with the second television service.

6. The method of claim 4, wherein the method is implemented by a digital home communication terminal that is coupled to the display device.

7. A system comprising:
a receiver for receiving user input; and
a processor that is coupled to the receiver and that is configured to:
establish an association between a first volume level and a first television service, responsive to the receiver receiving a first user input that facilitates association the first television service with the first volume level; and
provide the first television service to a display device and adjust an audio signal to achieve the first volume level, responsive to the receiver receiving a second user input requesting the first television service.

8. The system of claim 7, wherein the processor is further configured to:
establish an association between a second volume level and a second television service, responsive to the receiver receiving a third user input that facilitates associating the second television service with the second volume level; and
provide the second volume level to the display device and adjust an audio signal to achieve the second television service, responsive to the receiver receiving a fourth user input requesting the second television service.

9. The system of claim 7, wherein the system is a digital home communication terminal (DHCT).

10. A method for controlling an audio volume level that is output by a display device, comprising:
adjusting the audio volume level;
receiving a first user input that facilitates associating a first volume level with a first user input key;
responsive to receiving the first user input, associating the first volume level with the first user input key; and
responsive to activating the first user input key, adjust the audio volume level of the display device to the first volume level.

11. The method of claim 10, wherein the display device is a television.

12. The method of claim 10, further comprising:
receiving a second user input that facilitates associating a second volume level with a second user input key;
responsive to receiving the second user input, associating the second audio volume level with the second user input key and
responsive to activating the second user input key, adjust the audio volume level of the display device to the second volume level.

13. The method of claim 12, further comprising:
receiving a third user input that facilitates associating a third audio volume level with a third user input key;
responsive to receiving the third user input, associating the third audio volume level with the third user input key; and
responsive to activating the third user input key, adjust the audio volume level of the display device to the third volume level.

14. The method of claim 10, wherein the method is implemented by a digital home communication terminal that is coupled to the display device.

15. The method of claims 10, wherein the method is implemented by the display device.

16. A system comprising:
a receiver for receiving user input; and
a processor that is coupled to the receiver and that is configured to:
adjust an audio volume level of a display device;
receive a first user input that facilitates associating a first volume level with a first user input key;
responsive to the receiver receiving the first user input, associating the first volume level with the first user input key; and
responsive to activating the first user input key, adjust the audio volume level of the display device to the first volume level.

17. The system of claim 16, wherein the processor is further configured to:
receive a second user input that facilitates associating a second volume level with a second user input key;
responsive to the receiver receiving the second user input, associating the second volume level with the second user input key; and
responsive to activating the second user input key, adjust the audio volume level of the display device to the second volume level.

18. The system of claim 17, wherein the processor is further configured to:
receive a third user input that facilitates associating a third volume level with a third user input key; and
responsive to the receiver receiving the third user input, associating the third volume level with the third user input key; and
responsive to activating the third user input key, adjust the audio volume level of the display device to the third volume level.

19. The system of claim 18, wherein the first volume level is at a low volume, the second volume level is at a medium volume, and the third volume level is at a high volume.

20. The system of claim 16, wherein the system is a digital home communication terminal (DHCT).

21. The system of claim 16, wherein the system is a television.

* * * * *